United States Patent
Skinner et al.

(10) Patent No.: US 6,191,475 B1
(45) Date of Patent: *Feb. 20, 2001

(54) SUBSTRATE FOR REDUCING ELECTROMAGNETIC INTERFERENCE AND ENCLOSURE

(75) Inventors: Harry G. Skinner, Beaverton; Neil C. Delaplane, Tualatin, both of OR (US); Ravi V. Mahajan, Tempe, AZ (US); Robert Starkston; Mirng-ji Lii, both of Chandler, AZ (US); Ron Edsall, Beaverton, OR (US)

(73) Assignee: Intel Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/979,502

(22) Filed: Nov. 26, 1997

(51) Int. Cl.$^7$ ............ H01L 23/14; H01L 23/34; H01L 23/48; H05K 1/14
(52) U.S. Cl. ............ 257/700; 257/659; 257/691; 257/774; 257/758; 257/748; 257/660; 257/759; 257/698; 361/816; 361/792; 174/255
(58) Field of Search .................. 257/700, 666, 257/691, 659, 660, 203, 207, 208, 211, 662, 664, 658, 750, 759, 774, 748, 698; 361/816, 792, 818; 174/35 R, 255; 29/827

(56) References Cited

U.S. PATENT DOCUMENTS

| | | | |
|---|---|---|---|
| 3,916,490 | * 11/1975 | Sheahan et al. | 29/25.35 |
| 4,675,789 | * 6/1987 | Kuwabara et al. | 361/414 |
| 4,827,327 | * 5/1989 | Miyauchi et al. | 257/728 |
| 4,914,503 | * 4/1990 | Shirato et al. | 257/691 |
| 4,974,041 | * 11/1990 | Grinberg | 257/347 |
| 5,119,169 | * 6/1992 | Kozono et al. | 257/369 |
| 5,283,717 | * 2/1994 | Hundt | 257/666 |
| 5,315,182 | * 5/1994 | Sakashita et al. | 257/207 |
| 5,371,411 | * 12/1994 | Hara et al. | 257/207 |
| 5,401,989 | * 3/1995 | Kikuchi | 257/211 |
| 5,426,405 | * 6/1995 | Miller et al. | 333/247 |
| 5,468,998 | * 11/1995 | Hara et al. | 257/691 |
| 5,491,352 | * 2/1996 | Tsuji | 257/211 |
| 5,502,278 | * 3/1996 | Mabboux et al. | 174/52.4 |
| 5,586,011 | * 12/1996 | Alexander | 361/818 |
| 5,616,952 | * 4/1997 | Nakano et al. | 257/659 |
| 5,639,989 | * 6/1997 | Higgins, III | 174/35 MS |
| 5,640,048 | * 6/1997 | Selna | 257/664 |
| 5,672,911 | * 9/1997 | Patil et al. | 257/691 |
| 5,686,699 | * 11/1997 | Chu et al. | 257/774 |
| 5,717,245 | * 2/1998 | Pedder | 257/691 |
| 5,741,726 | * 4/1998 | Barber | 438/125 |
| 5,831,331 | * 11/1998 | Lee | 257/659 |

(List continued on next page.)

Primary Examiner—Alexander O. Williams
(74) Attorney, Agent, or Firm—Blakely, Sokoloff, Taylor & Zafman LLP

(57) ABSTRACT

A substrate for reducing electromagnetic emissions is provided. The substrate may include a plurality of ground layers, signal layers and power layers. All of the layers other than the ground layer are provided with a ground ring that may extend around the perimeter of the layer. The ground rings are electrically coupled together by ground stitching or vias that are randomly spaced. The random spacing of the ground stitching is based on the operating frequencies of the integrated circuit devices mounted on the substrate. Additional shielding may be provided by providing a cover assembly made of any conductive material that is coupled to the exposed ground rings on the uppermost and lowermost surfaces of the substrate. The cover assembly is coupled to the exposed ground rings in a randomized pattern. The device provides a virtual electrical ground cage in which the internal signal layers are totally enclosed, thereby reducing electromagnetic emissions.

23 Claims, 3 Drawing Sheets

U.S. PATENT DOCUMENTS 5,847,466 * 12/1998 Ito et al. ................................ 257/775
5,877,551 * 3/1999 Tostado et al. ....................... 257/701
5,895,967 * 4/1999 Stearns et al. ........................ 257/691
5,952,704 * 9/1999 Yu et al. ............................... 257/531
6,020,637 * 2/2000 Karnezos ............................. 257/774
6,052,045 * 4/2000 Martich ................................ 335/151

* cited by examiner

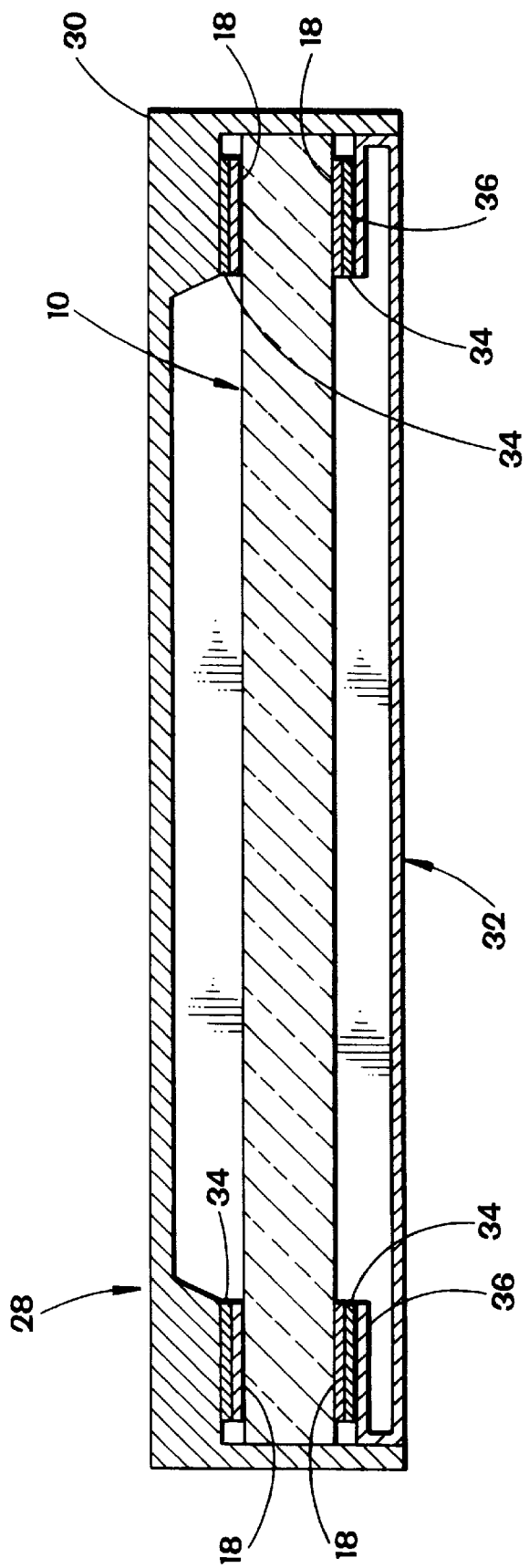

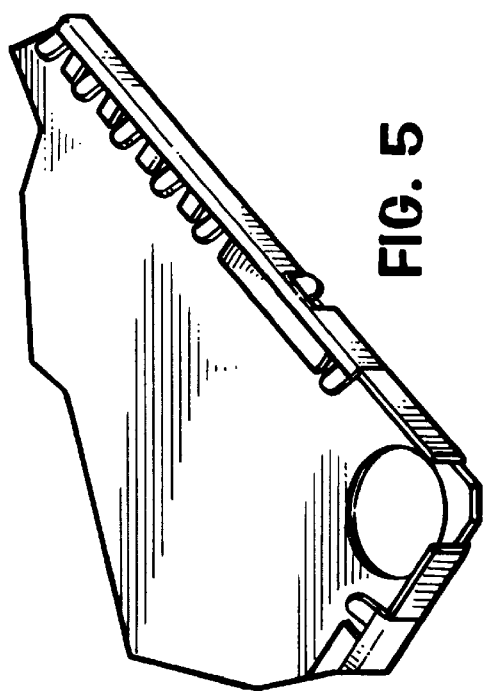
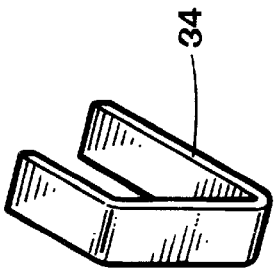
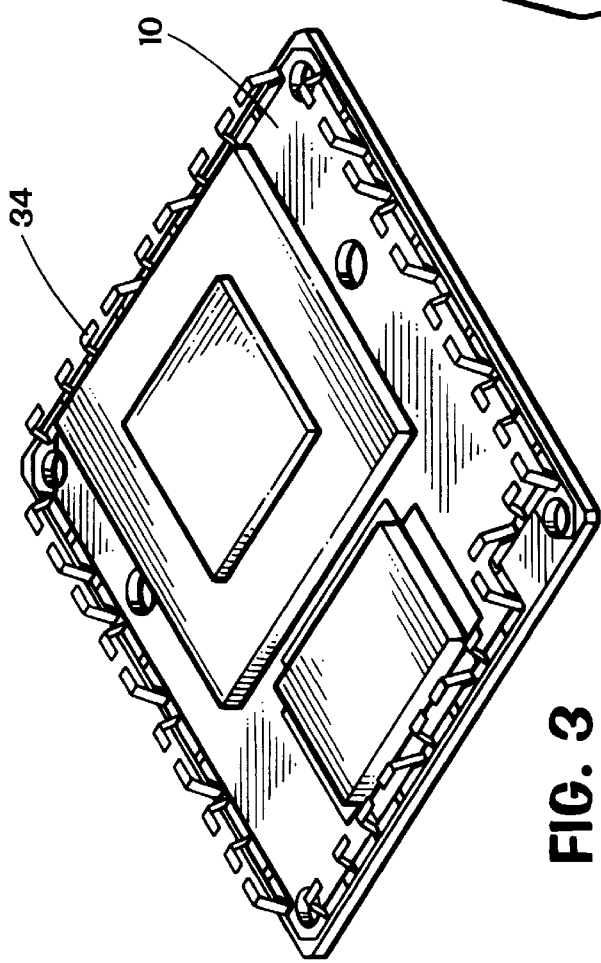

SUBSTRATE FOR REDUCING ELECTROMAGNETIC INTERFERENCE AND ENCLOSURE

BACKGROUND OF THE INVENTION

1. Field of the Invention

This invention relates generally to a substrate upon which integrated circuit components are mounted and, more particularly, to a substrate that reduces electromagnetic emissions and associated electromagnetic interference problems.

2. Description of the Related Art

In the field of electronics, various integrated circuit components, such as microprocessors, are commonly mounted on a substrate. This substrate is typically comprised of ground layers, signal layers, and power layers. The signal layer contains traces that allow the transmission of various signals between the various integrated circuit components positioned on the substrate.

It is well known in the art that signals traveling within these traces can produce electromagnetic emissions, i.e., radiated electrical fields. Electromagnetic interference ("EMI") can cause several problems, such as malfunctions of nearby electrical devices and interference or degradation of signals traveling along other traces. EMI problems have resulted in the Federal Communications Commission adopting guidelines for maximum allowable levels of electromagnetic emissions in various electronic devices.

It is also well known that faster signal speeds lead to more EMI problems. With the emphasis on increased operating speeds of today's integrated circuit devices, EMI problems also increase.

SUMMARY OF THE INVENTION

In one aspect of the present invention, a substrate for integrated circuit devices is provided that reduces the amount of electromagnetic emissions generated by the integrated circuit devices mounted on the substrate. More particularly, the substrate is comprised of a plurality of layers, which may include signal layers, power layers and ground layers. At least two of these layers each have ground rings that are electrically coupled together by ground stitches. The present invention thus provides a virtual electric ground cage in which high speed signal traces located on the signal layer are embedded within the substrate, thereby preventing or reducing EMI problems when the integrated circuit devices are operating.

In another aspect of the invention, a substrate for mounting integrated circuit devices is provided that comprises a plurality of layers, including signal layers, power layers and ground layers. Each of the layers, other than ground layers, have a ground ring that is electrically coupled to other ground rings by means of ground stitches. The ground stitches are spaced in a random pattern. The randomized spacing of the ground stitches acts to reduce or prevent the generation of standing electromagnetic waves that might otherwise exist if uniform spacing were employed between the ground stitches.

In another aspect of the instant invention, a cover assembly is provided that may be electrically coupled to exposed ground rings on the substrate of the present invention. Electrical coupling between the cover assembly and one or more of the ground rings of the substrate may be provided by electrically conductive clips or gasket material. The cover assembly provides additional shielding that will help prevent or reduce electromagnetic emissions from the integrated circuit devices operating on the substrate.

BRIEF DESCRIPTION OF THE DRAWINGS

Other objects and advantages of the invention will become apparent upon reading the following detailed description and upon reference to the drawings in which:

FIG. 2 is a cross-sectional view showing a cover assembly that may be used in association with the present invention;

FIG. 3 is a perspective view of the substrate showing the electrically conductive clip of the present invention;

FIG. 4 is a perspective view of an electrically conductive clip of the present invention; and FIG. 5 is a perspective view of the electrically conductive spring fingers of the present invention.

Figure 1:
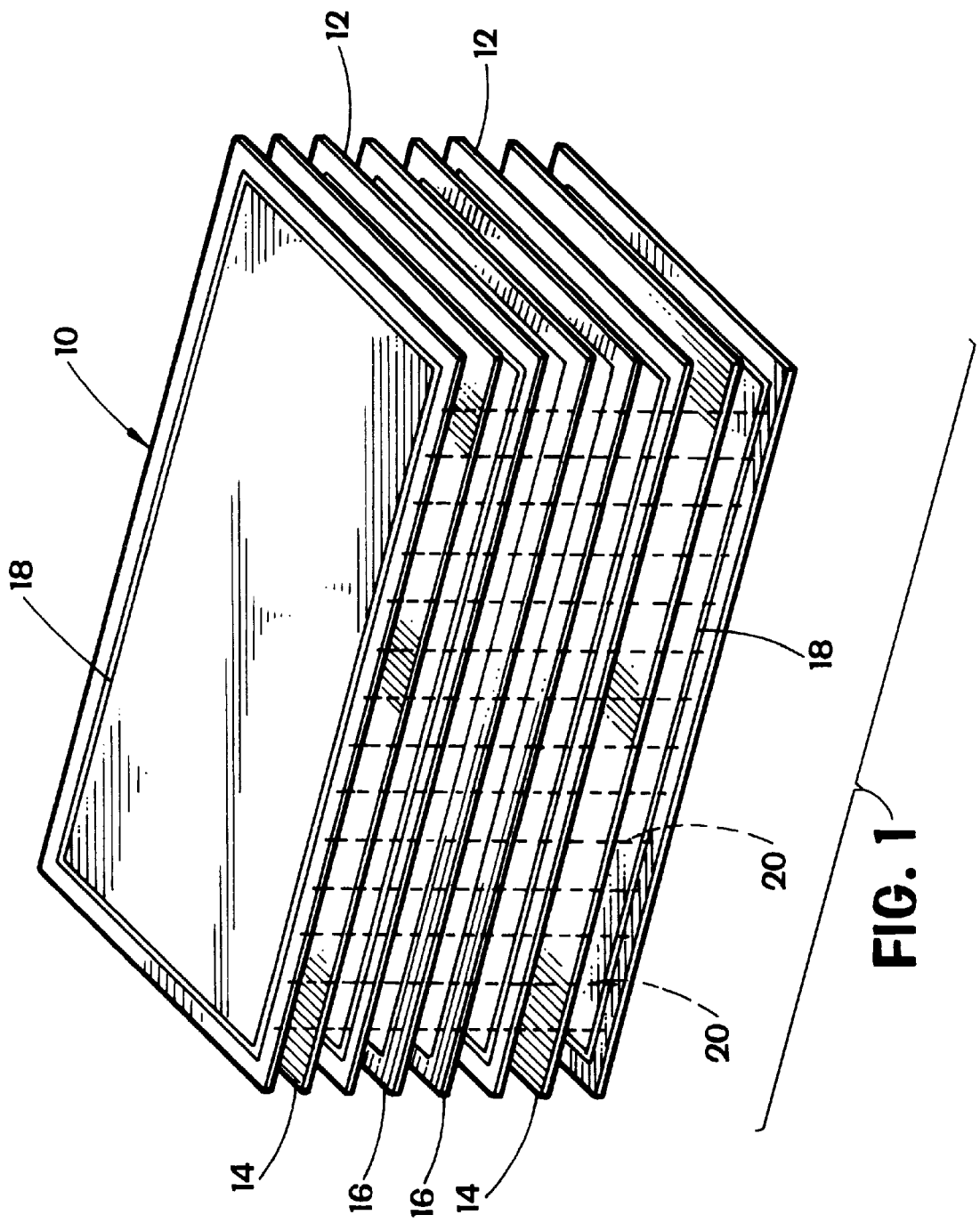
FIG. 1 is an exploded perspective view of one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Turning now to the drawings, and particularly to FIG. 1, a perspective, exploded view of a substrate 10 for mounting various integrated circuit components is shown. The substrate 10 may be comprised of multiple signal layers 12, ground layers 14, and power layers 16. Ground rings 18 may be placed on all layers of the substrate material except the ground layers 14.

In one embodiment, the ground rings 18 are continuous and extend around the entire perimeter of each signal layer 12 and power layer 16, as shown in the drawings. However, it should be understood that the ground rings 18 are not required to extend completely around the perimeter of each layer 12, 16 in order to fall within the scope of this invention. In fact, a ground ring 18 could be highly localized in that it may only extend around a particular portion of a layer, e.g., it may only extend around a high speed subsystem such as a graphics chip. It should also be understood that the ground rings 18 need not be continuous on any given layer 12, 16. That is, there may be gaps in the ground rings 18 at one or more places on each of the layers 12, 16. In one embodiment, the ground rings 18 are 30 mils wide (0.030 inch), but may be of any desired width.

The ground rings 18 are electrically coupled together by ground stitches 20, known as vias, at various points along the ground rings 18. In one embodiment, the ground stitches 20 may be electrically coupled to all of the ground rings 18 in the signal and power layers 12, 16 and one or more of the ground layers 14 shown in FIG. 1.

In one embodiment, the ground stitches 20 are randomly spaced. That is, the spacing between the ground stitches 20 is random and varied. Of course, the location of any particular ground stitch 20 may be governed by practical constraints such as space availability. The maximum spacing between adjacent ground stitches 20 is based upon the frequency of operation of the integrated circuit devices on the substrate 10. To account for the existence of harmonics of the original frequency of the integrated circuit devices, the frequency of the integrated circuit devices is multiplied by about 7 or 8 to arrive at a design set point frequency. The spacing between adjacent ground stitches 20 should be designed such that the gap between adjacent ground stitches 20 is no larger than 1/20th of the wavelength of this design point frequency. For example, a substrate having a 166 MHz microprocessor mounted thereon would result in a design point frequency of approximately 1.2 GHz from which can be derived a maximum spacing of about 12.5 millimeters or approximately 0.5 inch between ground stitches 20. In one embodiment, designed to operate with integrated circuit devices operating at up to 166 MHz, the spacing between the ground stitches 20 varies between 0.25 inch and 0.5 inch. The 0.25 inch spacing is determined by practical considerations such as manufacturing tolerances and space limitations.

Another aspect of the present invention is that the ground rings 18 on the uppermost and lowermost layers of the substrate 10 are not coated with any insulating material, e.g., solder mask, thereby facilitating easy ground and/or shielding contact that may enhance a customer's EMI performance. Another advantage of having the ground rings 18 on the signal layers 12 is that it allows for the routing of high speed signal traces closer to the edge of the substrate. Absent the ground rings 18 on the perimeter of the signal layers 12, high speed traces in the vicinity of the edge of the substrate 10 have a greater opportunity for fringe coupling.

As shown in FIG. 2, a cover assembly 28 made of a conductive material, such as stainless steel or aluminum, is electrically coupled to the assembled substrate 10 so as to provide further shielding to reduce the amount of electromagnetic emissions. The cover assembly 28 in the embodiment shown in FIG. 2 is comprised of top cover 30 and bottom cover 32.

The components of the cover assembly 28 may be coupled to the exposed ground rings 18 on the uppermost and lowermost surfaces of the substrate 10 by means of solder plated clips 34 (as shown in FIGS. 3 and 4) that are surface mounted adjacent the ground ring 18 on the uppermost surface of the substrate 10. Contact between the bottom cover 32 and the exposed ground ring 18 on the lower surface of substrate 10 is achieved by use of spring fingers 36 coupled to or formed as part of the bottom cover 32 as shown in FIG. 5. In one embodiment, the clips 34 are copper beryllium clips. However, it should be readily understood that such clips may be formed from a variety of suitable conductive material without departing from the spirit and scope of the instant invention. Moreover, the electrical contact between the cover assembly 28 and any of the exposed ground rings 18 may be accomplished by use of a conductive gasket material. Such materials could include carbon-, nickel- or silver-based gaskets or metal film coated plastic gaskets. Such materials are commercially available from manufacturers such as W.L. Gore and Chomerics.

The contact points between the cover assembly 28 and the ground rings 18 on the substrate 10 are defined and spaced in a similar fashion as with respect to the ground stitches 20 discussed above with respect to FIG. 1, i.e., the spacing is random with a maximum spacing defined by the frequency of operation of the integrated circuit devices on the substrate. Of course, it should be readily understood that it is not necessary for both the top cover 30 and the bottom cover 32 to each be separately electrically coupled to the ground rings 18 on the substrate 10. For example, the bottom cover 32 could simply be coupled to the top cover 30, which would be the only component electrically coupled to the ground rings 18 on the substrate.

The present invention acts to reduce the amount of electromagnetic emissions and thus reduce the electromagnetic interference problems that may cause signal degradation in nearby circuits. The random spacing of the ground stitches 20 stops or reduces the generation of standing waves that could be created if the spacing between the ground stitches 20 was uniform. The present invention creates a virtual electrical ground cage around the substrate 10 in which the internal signal layers are totally enclosed. Additional shielding can be provided by use of a cover assembly 30 made of a conductive material that is coupled to the exposed ground rings 18 on the substrate 10. Such a cover assembly provides additional shielding that reduces the electromagnetic emissions produced while the integrated circuit devices mounted on the substrate 10 are operating.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A substrate for an integrated circuit device, comprising:

a plurality of layers;

at least two of said layers each having a ground ring; and a plurality of non-uniformly spaced ground stitches electrically coupling said ground rings on said two layers to reduce electromagnetic interference.

2. The substrate as set forth in claim 1 wherein said ground stitches are randomly spaced.

3. The substrate as set forth in claim 1 wherein said ground rings are continuous.

4. The substrate as set forth in claim 1 wherein each of said ground rings extend around the perimeter of each of said two layers.

5. The substrate as set forth in claim 1 wherein at least one of said ground rings extends around at least a portion of an integrated circuit located on said layer.

6. The substrate as set forth in claim 1 further comprising a cover assembly electrically coupled to at least one of said ground rings.

7. The substrate as set forth in claim 6 wherein said cover assembly is electrically coupled to at least one of said ground rings by a plurality of electrically conductive clips.

8. The substrate as set forth in claim 6 wherein said cover assembly is electrically coupled to at least one of said ground rings by an electrically conductive gasket material.

9. A substrate for an integrated circuit device, comprising
a plurality of layers comprised of at least one ground layer, at least one signal layer, and at least one power layer;
at least one of said signal layers and at least one of said power layers each having a ground ring; and,
a plurality of ground stitches electrically coupling said ground rings.

10. The substrate as set forth in claim 9 wherein said ground stitches are randomly spaced.

11. The substrate as set forth in claim 9 wherein maximum spacing of said ground stitches is related to a frequency of operation of a circuit contained in the integrated circuit device.

12. The substrate as set forth in claim 9 wherein said ground rings are continuous.

13. The substrate as set forth in claim 9 wherein said ground rings extend around the perimeter of each of said at least one signal layer and said at least one power layer.

14. The substrate as set forth in claim 9 wherein at least one of said ground rings extends around at least a portion of an integrated circuit located on at least one of said layers.

15. The substrate as set forth in claim 9 further comprising a cover assembly electrically coupled to at least one of said ground rings.

16. The substrate as set forth in claim 9 wherein said cover assembly is electrically coupled to at least one of said ground rings by a plurality of electrically conductive clips.

17. The substrate as set forth in claim 9 wherein said cover assembly is electrically coupled to at least one of said ground rings by an electrically conductive gasket material.

18. A substrate for an integrated circuit device, comprising:
a plurality of layers comprised of a plurality of signal layers and a plurality of power layers, each of said signal and power layers having a perimeter with a continuous ground ring there around; and
a plurality of randomly spaced ground stitches electrically coupling at least two of said ground rings together.

19. The substrate as set forth in claim 18 further comprising a cover assembly electrically coupled to at least one of said ground rings.

20. The substrate as set forth in claim 18 wherein said ground rings are continuous.

21. The substrate as set forth in claim 18 wherein at least one of said ground rings extends around at least a portion of an integrated circuit located on at least one of said layers.

22. The substrate as set forth on claim 18 wherein maximum spacing of said ground stitches is related to a frequency of operation of a circuit contained in the integrated circuit device.

23. The substrate of claim 1 wherein maximum spacing of said ground stitches is related to the frequency of a circuit contained in the integrated circuit device.

* * * * *